(12) United States Patent
Huang et al.

(10) Patent No.: US 7,109,090 B1
(45) Date of Patent: Sep. 19, 2006

(54) PYRAMID-SHAPED CAPACITOR STRUCTURE

(75) Inventors: Kun-Ming Huang, Taipei (TW); Yeh-Jye Wann, Hsinchu (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 0 days.

(21) Appl. No.: 11/074,523

(22) Filed: Mar. 7, 2005

(51) Int. Cl.
*H01L 21/8242* (2006.01)

(52) U.S. Cl. .................. 438/396; 438/253; 438/254; 438/397; 438/695; 257/296; 257/306; 257/532; 257/E27.048

(58) Field of Classification Search .......... 438/239, 438/250, 253, 393, 396, FOR. 220, FOR. 430, 438/254, 397, 695; 257/68, 71, 296, 298, 257/306, 311, 532, E27.034, E27.048, E27.071
See application file for complete search history.

(56) References Cited

U.S. PATENT DOCUMENTS

| | | | |
|---|---|---|---|
| 5,903,023 A * | 5/1999 | Hoshi | 257/300 |
| 6,207,499 B1 * | 3/2001 | Hoshi | 438/256 |
| 6,462,370 B1 * | 10/2002 | Kuwazawa | 257/296 |
| 6,579,764 B1 * | 6/2003 | Kuwazawa | 438/258 |
| 6,858,513 B1 * | 2/2005 | Fujisawa | 438/394 |
| 2002/0022335 A1 * | 2/2002 | Chen | 438/396 |
| 2003/0006442 A1 * | 1/2003 | Fujisawa | 257/296 |
| 2003/0127675 A1 * | 7/2003 | Fujisawa | 257/296 |
| 2005/0082586 A1 * | 4/2005 | Tu et al. | 257/296 |

* cited by examiner

*Primary Examiner*—Matthew Smith
*Assistant Examiner*—Joannie Adelle Garcia
(74) *Attorney, Agent, or Firm*—Tung & Associates

(57) ABSTRACT

A capacitor structure which has a generally pyramidal or stepped profile to prevent or reduce dielectric layer breakdown is disclosed. The capacitor structure includes a first conductive layer, at least one dielectric layer having a first area provided on the first conductive layer and a second conductive layer provided on the at least one dielectric layer. The second conductive layer has a second area which is less than the first area of the at least one dielectric layer. A method of fabricating a capacitor structure is also disclosed.

12 Claims, 5 Drawing Sheets

PYRAMID-SHAPED CAPACITOR STRUCTURE

FIELD OF THE INVENTION

The present invention relates to semiconductor devices, and more particularly, to a generally pyramid-shaped capacitor structure which is characterized by reduced vulnerability to edge breakdown in a semiconductor device.

BACKGROUND OF THE INVENTION

In the fabrication of semiconductor integrated circuits, metal conductor lines are used to interconnect the multiple components in device circuits on a semiconductor wafer. A general process used in the deposition of metal conductor line patterns on semiconductor wafers includes deposition of a conducting layer on the silicon wafer substrate; formation of a photoresist or other mask such as titanium oxide or silicon oxide, in the form of the desired metal conductor line pattern, using standard lithographic techniques; subjecting the wafer substrate to a dry etching process to remove the conducting layer from the areas not covered by the mask, thereby leaving the metal layer in the form of the masked conductor line pattern; and removing the mask layer typically using reactive plasma and chlorine gas, thereby exposing the top surface of the metal conductor lines. Typically, multiple alternating layers of electrically conductive and insulative materials are sequentially deposited on the wafer substrate, and conductive layers at different levels on the wafer may be electrically connected to each other by etching vias, or openings, in the insulative layers and filling the vias using aluminum, tungsten or other metal to establish electrical connection between the conductive layers.

A current drive in the semiconductor device industry is to produce semiconductors having an increasingly large density of integrated circuits which are ever-decreasing in size. These goals are achieved by scaling down the size of the circuit features in both the lateral and vertical dimensions. Vertical downscaling requires that the thickness of gate oxides on the wafer be reduced by a degree which corresponds to shrinkage of the circuit features in the lateral dimension. While there are still circumstances in which thicker gate dielectrics on a wafer are useful, such as to maintain operating voltage compatibility between the device circuits manufactured on a wafer and the current packaged integrated circuits which operate at a standard voltage, ultrathin gate dielectrics will become increasingly essential for the fabrication of semiconductor integrated circuits in the burgeoning small/fast device technology.

The ongoing advances in the field of fabricating miniaturized electronic integrated circuits (ICs) has involved the fabrication of multiple layers of interconnects, or the layers of separate electrical conductors which are formed on top of a substrate and connect various functional components of the substrate and other electrical connections to the IC. Electrical connections between the interconnect layers and the functional components on the substrate are achieved by via interconnects, which are post- or plug-like vertical connections between the conductors of the interconnect layers and the substrate. ICs often have five or more interconnect layers formed on top of the substrate.

Capacitors are one of the most common passive elements used in very large-scale integrated (VLSI) circuits. Capacitors are often integrated into active elements such as bipolar transistors or complementary metal oxide semiconductors (CMOS) transistors. Capacitors in semiconductor devices may have one of various forms, including polysilicon-insulator-polysilicon (PIP), metal-insulator-silicon (MIS), metal-insulator-metal (MIM) and metal-insulator-polysilicon (MIP).

A conventional MIP (Metal-Insulator-Polysilicon) capacitor structure 10 is shown in FIG. 1. The MIP capacitor structure 10 includes a polysilicon layer 12, a first dielectric layer 14 provided on the polysilicon layer 12, a second dielectric layer 16 provided on the first dielectric layer 14 and a metal layer 18 provided on the second dielectric layer 16. As shown in FIG. 1, the area of the dielectric layers 14, 16 is the same as the area of the metal layer 18. Thus, the edges 20 of the dielectric layers 14, 16 are flush with the edges 19 of the metal layer 18.

The capacitance (C) of the MIP capacitor structure 10 is a function of the dielectric film area (A) and the dielectric film thickness (d), according to the following equation: $C = \epsilon A/d$. The electrical charge (Q) established across the structure 10 is related to the capacitance (C) and voltage (V) differential according to the equation $Q = CV$. Therefore, increasing the area or decreasing the thickness of the dielectric layers 14, 16 correspondingly increases the capacitance, and thus, the charge established across the dielectric layers 14, 16 of the capacitor structure 10.

During application of an electrical charge (Q) across the first dielectric layer 14 and the second dielectric layer 16, the strength of the electric field 22 at the dielectric layer edges 20 and at the center region of the dielectric layers 14, 16 is non-uniform. This results in breakdown of the dielectric layers 14, 16 at the dielectric layer edges 20, causing electrical shorting of the capacitor structure 10. In MIP capacitor structures, the roughness of the polysilicon surface further contributes to breakdown of the dielectric layer or layers.

It is believed that optimizing the profile of a capacitor structure in such a manner that the area of the dielectric layer or layers is larger than the area of the metal or polysilicon layer facilitates formation of an electric field which is substantially uniform across all regions of the dielectric layer or layers. This prevents or substantially reduces breakdown of the dielectric layer edges of the capacitor structure.

Accordingly, an object of the present invention is to provide a novel, pyramid-shaped structure for a capacitor.

Another object of the present invention is to provide a novel capacitor structure which has a generally stepped profile to prevent or substantially reduce breakdown of the edges of a dielectric layer or layers.

Still another object of the present invention is to provide a novel capacitor structure which is applicable to an MIP (Metal-Insulator-Polysilicon) or a PIP (Polysilicon-Insulator-Polysilicon) capacitor structure.

Yet another object of the present invention is to provide a novel, generally pyramidal or stepped profile capacitor structure in which an electrically-insulating dielectric layer sandwiched between a metal layer and a polysilicon layer has an area which is larger than the area of the metal layer.

A still further object of the present invention is to provide a novel method of fabricating a capacitor structure having a generally pyramidal or stepped profile to prevent or substantially reduce the incidence of dielectric layer breakdown at the edges of a dielectric layer or layer sandwiched between a polysilicon layer and a metal layer or between two polysilicon layers.

SUMMARY OF THE INVENTION

In accordance with these and other objects and advantages, the present invention is generally directed to a novel pyramid-shaped capacitor structure for integrated circuit (IC) devices. In one embodiment, the pyramid-shaped MIP (Metal-Insulator-Polysilicon) capacitor structure has a generally stepped profile and includes a polysilicon layer on which is provided at least one dielectric layer. A metal layer is provided on the at least one dielectric layer and has an area which is less than the area of the dielectric layer. In another embodiment, the pyramid-shaped PIP (Polysilicon-Insulator-Polysilicon) capacitor structure includes a first polysilicon layer on which is provided at least one dielectric layer and a second polysilicon layer provided on the at least one dielectric layer. The second polysilicon layer has an area which is less than an area of the at least one dielectric layer. In both embodiments, the edges of the at least one dielectric layer are characterized by enhanced resistance to physical breakdown upon the establishment of an electrical field across the dielectric layer or layers.

The present invention is further directed to a method of fabricating a pyramid-shaped capacitor structure which is resistant to dielectric edge breakdown. The method includes providing a polysilicon layer, providing at least one dielectric layer on the polysilicon layer, providing a metal layer or second polysilicon layer on the at least one dielectric layer, providing a photoresist layer on the metal or polysilicon layer, dry-etching the metal or polysilicon layer, wet-etching the metal or polysilicon layer to render the area of the metal or polysilicon layer less than the area of the at least one dielectric layer, and stripping the photoresist layer from the metal or polysilicon layer.

BRIEF DESCRIPTION OF THE DRAWINGS

The invention will now be described, by way of example, with reference to the accompanying drawings, in which.

DETAILED DESCRIPTION OF THE INVENTION

The present invention contemplates a capacitor structure which has a generally pyramidal or stepped profile. The capacitor structure includes a bottom conductive layer, a top conductive layer and at least one dielectric layer interposed between the bottom and top conductive layers. The at least one dielectric layer has a surface area which is greater than the surface area of the top conductive layer. This imparts a stepped profile to the capacitor structure and facilitates establishment of a uniform electric field across the at least one dielectric layer of the capacitor, preventing or reducing breakdown of the dielectric layer edges throughout the lifetime of the capacitor structure.

While the terms "top" and "bottom" will be used herein to describe the relationship of various components with respect to each other in the capacitor structure, it is understood that components denoted in such a manner need not necessarily be positioned in vertically-spaced relationship with respect to each other in a semiconductor device but may be otherwise positioned with respect to each other in a manner which is consistent with the functional requirements of the capacitor structure in a semiconductor device.

Figure 1:
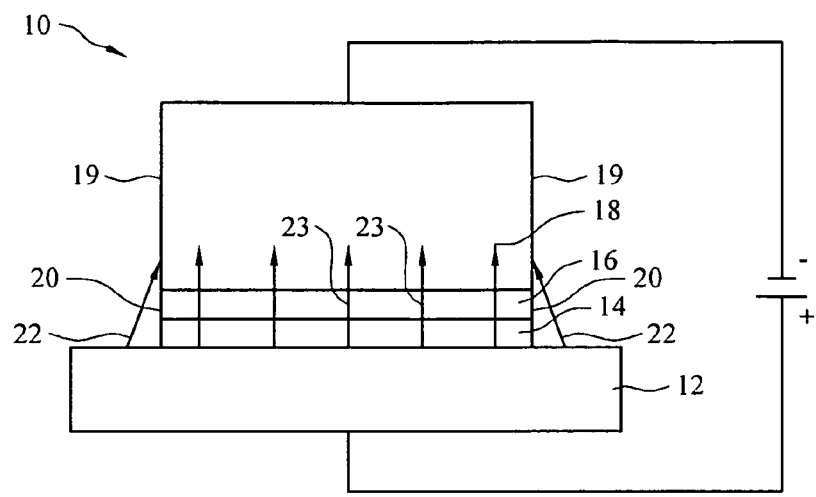
FIG. 1 is a cross-section of a conventional MIP (Metal-Insulator-Polysilicon) capacitor structure.
Figure 2:
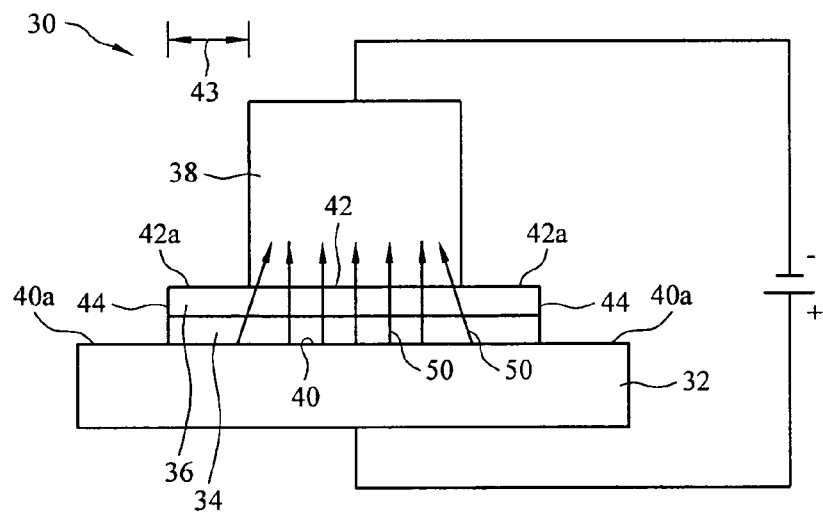
FIG. 2 is a cross-section of a pyramid-shaped capacitor structure according to the present invention.
Figure 3:
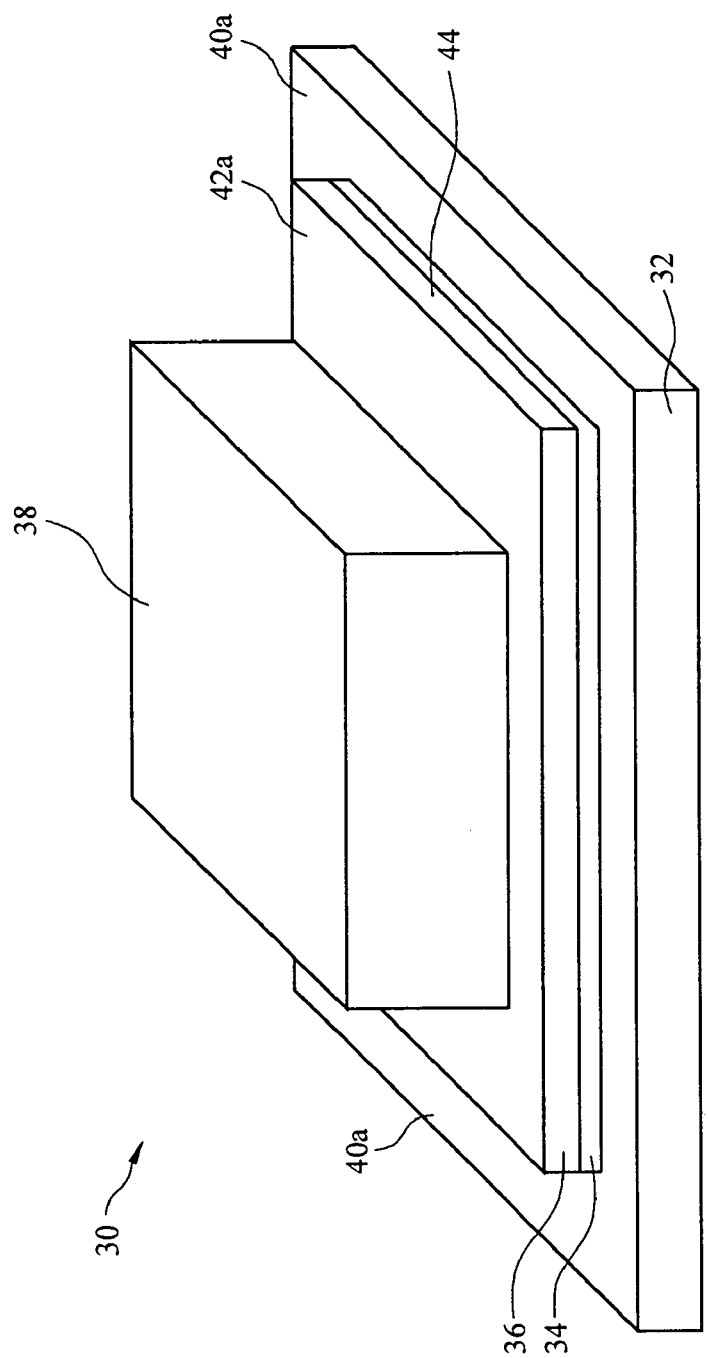
FIG. 3 is a perspective view of the pyramid-shaped capacitor structure shown in FIG. 2.

Referring to FIGS. 2 and 3, an illustrative embodiment of the pyramid-shaped capacitor structure of the present invention is generally indicated by reference numeral 30. The capacitor structure 30 includes a bottom conductive layer 32 which is typically polysilicon. At least one dielectric layer is provided on the upper surface 40 of the bottom conductive layer 32. In the embodiment of the capacitor structure 30 shown in FIGS. 2 and 3, a bottom dielectric layer 34 is provided on the upper surface 40 of the bottom conductive layer 32, and a top dielectric layer 36 is provided on the bottom dielectric layer 34. The bottom dielectric layer 34 may be $SiO_2$, for example, and has a thickness of typically about 250 angstroms. The top dielectric layer 36 may be $Si_3N_4$, for example, and has a thickness of typically about 320 angstroms.

A top conductive layer 38 is provided on the upper surface 42 of the top dielectric layer 36. The capacitor structure 30 may be a MIP (Metal-Insulator-Polysilicon) capacitor structure, for example, in which case the top conductive layer 38 is a metal such as copper, for example. Alternatively, the capacitor structure 30 may be a PIP (Polysilicon-Insulator-Polysilicon) capacitor structure, for example, in which case the top conductive layer 38 is polysilicon.

The upper surface 40 of the bottom conductive layer 32 has an area which is larger than the area of each of the bottom dielectric layer 34 and the top dielectric layer 36. Therefore, the upper surface 40 of the bottom conductive layer 32 includes an exposed surface 40a which extends around the bottom dielectric layer 34 and top dielectric layer 36, as shown in FIG. 3. Moreover, the upper surface 42 of the top dielectric layer 36 has an area which is larger than the area of the top conductive layer 38. Therefore, the upper surface 42 of the top dielectric layer 36 includes an exposed surface 42a which extends around the bottom of the top conductive layer 38. As shown in FIG. 2, the exposed surface 42a of the top dielectric layer 36 has a width 43 of typically at least about 0.1 μm (1000 angstroms).

As shown in FIG. 2, during application of electrical charges to the bottom conductive layer 32 and top conductive layer 38 to form a voltage potential across the bottom dielectric layer 34 and top dielectric layer 36, an electrical field is established. Due to the exposed surface 42a on the top dielectric layer 36, the magnitude of the electric field 50 is substantially the same throughout all regions of the bottom dielectric layer 34 and the top dielectric layer 36. This prevents or substantially reduces breakdown of the dielectric edges 44 of the bottom dielectric layer 34 and/or the top dielectric layer 36 throughout the lifetime of the capacitor structure 30.

Figure 4A:
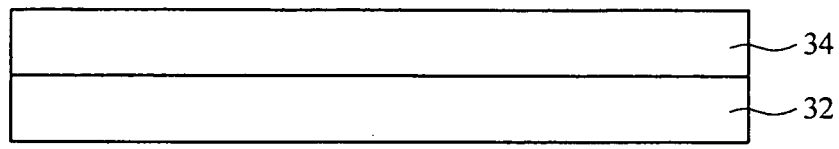
FIGS. 4A–4G are cross-sectional views illustrating sequential process steps carried out in fabrication of a pyramid-shaped capacitor structure according to the present invention.

In FIGS. 4A–4G, an illustrative process of fabricating the capacitor structure 30 is shown. Unless otherwise noted, the fabrication process may be carried out using conventional deposition and etching techniques known by those skilled in the art. As shown in FIG. 4A, a bottom conductive layer 32 is initially provided. The bottom conductive layer 32 is typically a polysilicon layer, which may be a polysilicon wafer substrate or a polysilicon layer formed on a wafer substrate. As further shown in FIG. 4A, a bottom dielectric layer 34, which is typically $SiO_2$, is formed on the bottom conductive layer 32. Preferably, the bottom dielectric layer 34 has a thickness of typically about 250 angstroms.

Figure 4B:
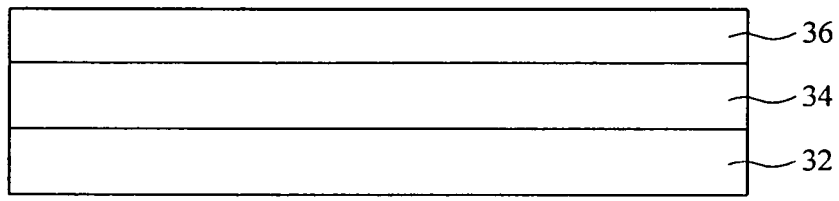

As shown in FIG. 4B, a top dielectric layer 36 may be formed on the bottom dielectric layer 34. The top dielectric layer 36 is typically $Si_3N_4$ and has a thickness of typically about 320 angstroms.

Figure 4C:
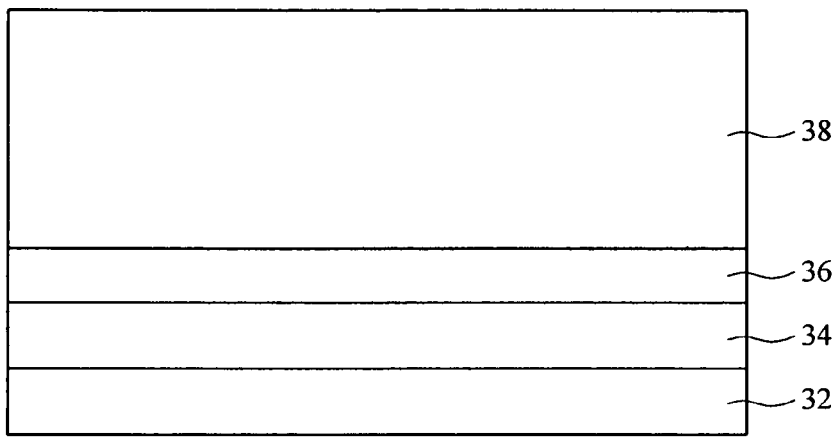

A top conductive layer 38 is next formed on the top dielectric layer 36, as shown in FIG. 4C. In the embodiment in which the capacitor structure 30 is a MIP (Metal-Insulator-Polysilicon) capacitor, the top conductive layer 38 is a metal such as copper. In the embodiment in which the capacitor structure 30 is a PIP (Polysilicon-Insulator-Polysilicon) capacitor, the top conductive layer 38 is polysilicon.

Figure 4D:
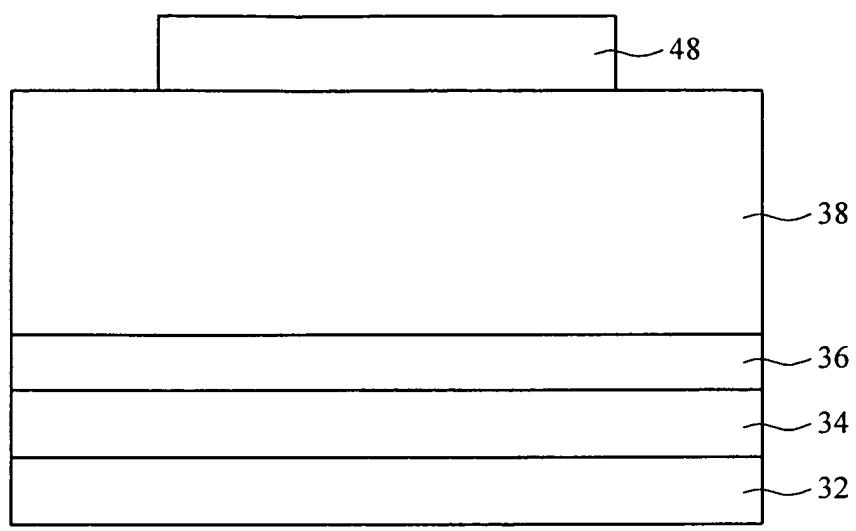
Figure 4E:
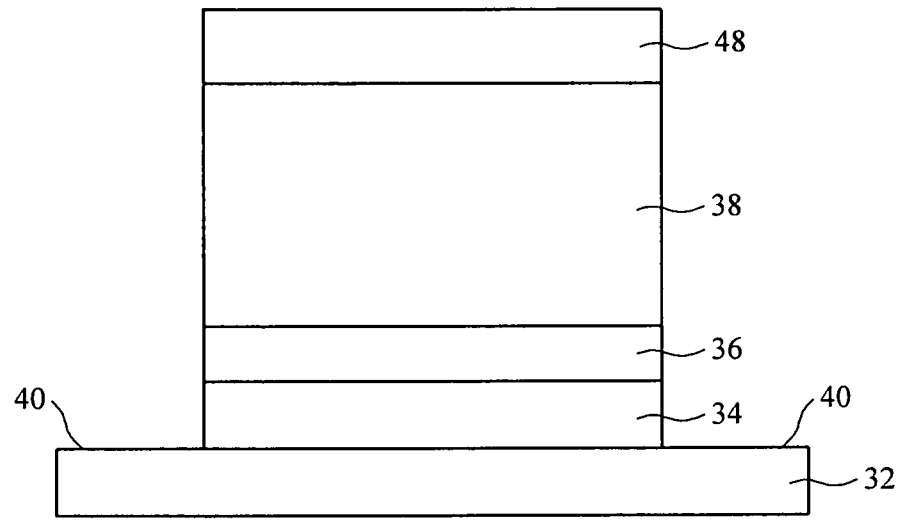

As shown in FIG. 4D, a photoresist layer 48 is formed and patterned on the top conductive layer 38. The photoresist layer 48 defines a desired width of the conductive layer 38. As shown in FIG. 4E, a dry-etching process is next carried out to etch the top conductive layer 38, top dielectric layer 36 and bottom dielectric layer 34 according to the dimensions defined by the patterned photoresist layer 48.

Figure 4F:
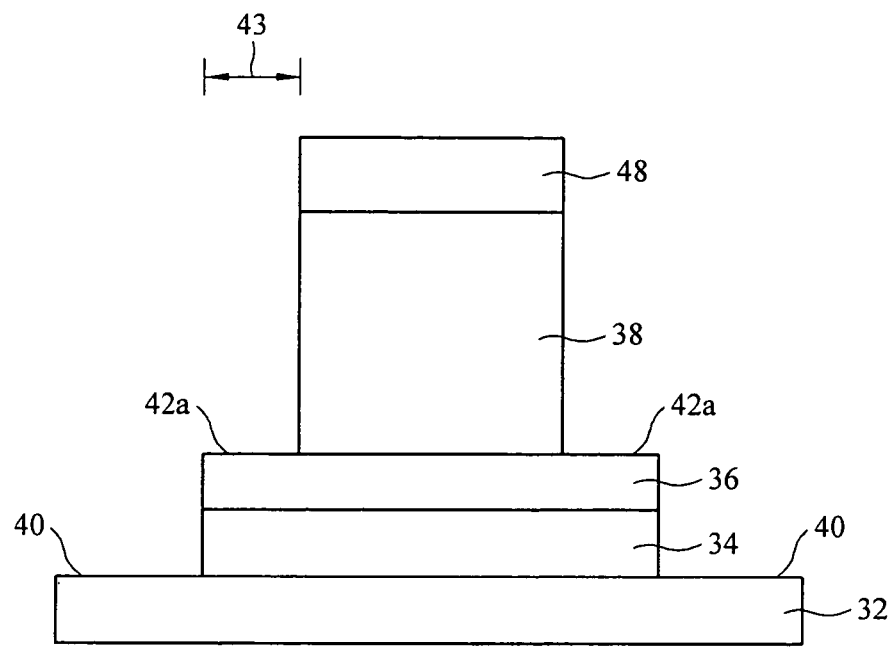
Figure 4G:
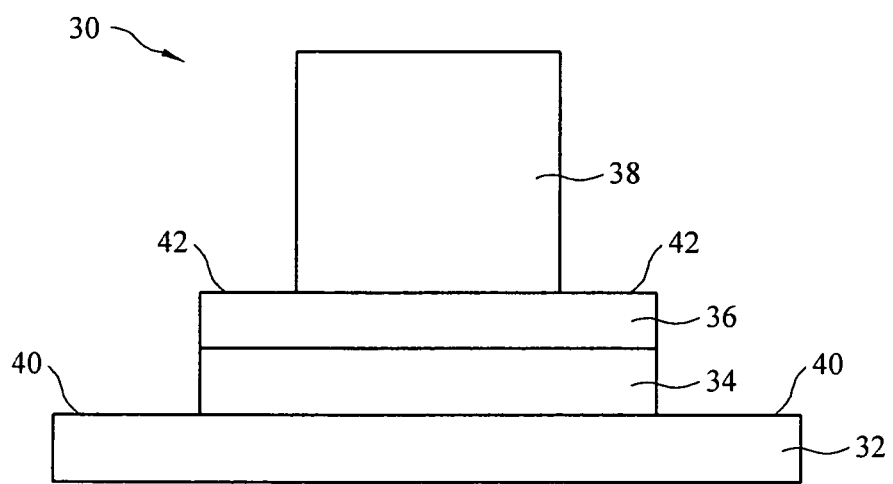

As shown in FIG. 4F, a wet etching step is next carried out for typically at least one minute to etch the sides of the top conductive layer 38 and uncover the exposed surface 42a of the top dielectric layer 36. A sufficient quantity of material is etched from the top conductive layer 38 to form an exposed surface 42a of the top dielectric layer 36 having a width 43 of typically at least about 0.1 μm (1000 angstroms). By use of a CAD bias for the wet etching process, the area obtained for the top conductive layer 38 can be selected depending on the desired capacitance for the capacitor structure 30. Finally, as shown in FIG. 4G, the photoresist layer 48 (FIG. 4F) is stripped from the top conductive layer 38 to complete fabrication of the capacitor structure 30.

While the preferred embodiments of the invention have been described above, it will be recognized and understood that various modifications can be made in the invention and the appended claims are intended to cover all such modifications which may fall within the spirit and scope of the invention.

What is claimed is:

1. A capacitor structure comprising:
   a first conductive layer having a first area;
   at least one dielectric layer having a second area less than said first area provided on said first conductive layer, said at least one dielectric layer concentric with said first conductive layer and said first conductive layer having an exposed surface surrounding said at least one dielectric layer; and
   a second conductive layer provided on said at least one dielectric layer, said second conductive layer having a third area less than said second area of said at least one dielectric layer and said second conductive layer concentric with said at least one dielectric layer.

2. The capacitor structure of claim 1 wherein said first conductive layer comprises polysilicon.

3. The capacitor structure of claim 2 wherein said second conductive layer comprises metal.

4. The capacitor structure of claim 2 wherein said second conductive layer comprises polysilicon.

5. The capacitor structure of claim 1 wherein said at least one dielectric layer comprises an exposed surface having a width of at least about 0.1 μm.

6. The capacitor structure of claim 1 wherein said at least one dielectric layer comprises a first dielectric layer provided on said first conductive layer and a second dielectric layer provided on said first dielectric layer.

7. The capacitor structure of claim 6 wherein said first dielectric layer comprises $SiO_2$ and has a thickness of about 250 angstroms and said second dielectric layer comprises $Si_3N_4$ and has a thickness of about 320 angstroms.

8. A method of fabricating a capacitor structure, comprising:
   providing a first conductive layer;
   providing at least one dielectric layer on said first conductive layer;
   providing a second conductive layer on said at least one dielectric layer;
   etching said second conductive layer and said at least one dielectric layer to a first width; and
   etching said second conductive layer to a second width less than said first width.

9. The method of claim 8 wherein said first conductive layer comprises polysilicon.

10. The method of claim 8 wherein said second conductive layer comprises metal.

11. The method of claim 8 wherein said second conductive layer comprises polysilicon.

12. The method of claim 8 wherein said second width is at least about 0.1 μm.

* * * * *